(12) United States Patent
Wacyk (10) Patent No.: US 10,297,645 B2
(45) Date of Patent: May 21, 2019

(54) ARRANGEMENT OF COLOR SUB-PIXELS FOR FULL COLOR OLED AND METHOD OF MANUFACTURING SAME

(71) Applicant: eMagin Corporation, Hopewell Junction, NY (US)

(72) Inventor: Ihor Wacyk, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/697,372

(22) Filed: Sep. 6, 2017

(65) Prior Publication Data

US 2018/0053812 A1 Feb. 22, 2018

Related U.S. Application Data

(62) Division of application No. 15/243,197, filed on Aug. 22, 2016.

(51) Int. Cl.
*H01L 27/32* (2006.01)
*H01L 51/56* (2006.01)
*H01L 51/00* (2006.01)

(52) U.S. Cl.
CPC ...... *H01L 27/3218* (2013.01); *H01L 27/3216* (2013.01); *H01L 51/0011* (2013.01); *H01L 51/56* (2013.01)

(58) Field of Classification Search
CPC ............ H01L 27/3211; H01L 27/3216; H01L 27/3218
See application file for complete search history.

(56) References Cited

U.S. PATENT DOCUMENTS

| 5,711,693 A | 1/1998 | Nam et al. |
| 5,748,268 A | 5/1998 | Kalmanash |

(Continued)

FOREIGN PATENT DOCUMENTS

| CN | 202183373 U | 4/2012 |
| EP | 2830036 | 1/2015 |

(Continued)

OTHER PUBLICATIONS

Authorized Officer: Eli Sarit, "International Search Report and Written Opinion dated Aug. 8, 2016 in counterpart PCT Application No. PCT/US2016/030414" Publisher: PCT, Published in: Israel.

(Continued)

*Primary Examiner* — Victoria K. Hall
(74) *Attorney, Agent, or Firm* — Kaplan Breyer Schwarz, LLP (57) ABSTRACT

A full-color display panel is provided comprising a repeating super-pixel block including four pixel units, wherein each of the pixel units has a first sub-pixel configured to emit a first color light, a second sub-pixel configured to emit a second color light, and a third sub-pixel configured to emit a third color light. The first or second sub-pixel abuts the same-color sub-pixel of the adjacent pixel unit thereof to form at least a double-sized sub-pixel area. The third sub-pixel abuts the same-color sub-pixel of all adjacent pixel units thereof to form at least a quadruple-sized sub-pixel area. The first color light, the second color light, and the third color light are one of emitted through or from respective organic layers of the first color sub-pixel, the second color sub-pixel and the third color sub-pixel.

6 Claims, 10 Drawing Sheets

(56) References Cited

U.S. PATENT DOCUMENTS

| | | | |
|---|---|---|---|
| 6,097,455 A | 8/2000 | Babuka et al. | |
| 6,498,692 B1 | 12/2002 | Hassner et al. | |
| 6,567,138 B1 | 5/2003 | Krusius et al. | |
| 6,967,111 B1 | 11/2005 | Hata | |
| 7,129,634 B2 | 10/2006 | Boronson et al. | |
| 7,394,194 B2 | 7/2008 | Cok | |
| 7,583,279 B2 | 9/2009 | Brown Elliott et al. | |
| 8,177,335 B2 | 5/2012 | Gerner et al. | |
| 8,552,635 B2 | 10/2013 | Kim et al. | |
| 8,742,659 B2 | 6/2014 | Chang | |
| 8,796,740 B1 | 8/2014 | Landis et al. | |
| 8,816,331 B2 | 8/2014 | Choi et al. | |
| 9,123,266 B2 | 9/2015 | Bastani et al. | |
| 9,147,611 B1 | 9/2015 | Landis et al. | |
| 9,829,710 B1 | 11/2017 | Newell et al. | |
| 2002/0001026 A1* | 1/2002 | Ishikawa | H01L 51/0005 347/101 |
| 2002/0015110 A1 | 2/2002 | Brown Elliott | |
| 2002/0163301 A1 | 11/2002 | Morley et al. | |
| 2003/0160915 A1 | 8/2003 | Liu | |
| 2004/0195963 A1 | 10/2004 | Choi et al. | |
| 2005/0003633 A1 | 1/2005 | Mahle et al. | |
| 2006/0033422 A1 | 2/2006 | Chao et al. | |
| 2006/0125506 A1 | 6/2006 | Hara et al. | |
| 2007/0024183 A1 | 2/2007 | Lih et al. | |
| 2007/0035239 A1 | 2/2007 | Kang et al. | |
| 2007/0108899 A1 | 5/2007 | Jung et al. | |
| 2007/0176859 A1 | 8/2007 | Cok et al. | |
| 2008/0001864 A1 | 1/2008 | Lee et al. | |
| 2009/0035518 A1 | 2/2009 | Wang et al. | |
| 2009/0115970 A1 | 5/2009 | Morejon et al. | |
| 2011/0220921 A1* | 9/2011 | Tamura | H01L 27/3218 257/88 |
| 2012/0006978 A1 | 1/2012 | Ludwig | |
| 2013/0208003 A1 | 8/2013 | Bohn et al. | |
| 2014/0140019 A1 | 5/2014 | Park et al. | |
| 2014/0197379 A1 | 7/2014 | Li | |
| 2014/0313112 A1 | 10/2014 | Madhusudan | |
| 2015/0054719 A1 | 2/2015 | Lee et al. | |
| 2015/0311269 A1 | 10/2015 | Hsu et al. | |
| 2015/0331508 A1 | 11/2015 | Nho et al. | |
| 2016/0322434 A1 | 11/2016 | Ghosh et al. | |
| 2016/0329385 A1* | 11/2016 | Qiu | H01L 27/3218 |
| 2016/0343284 A1 | 11/2016 | Sun | |
| 2017/0075475 A1 | 3/2017 | Miyake | |
| 2017/0194389 A1 | 7/2017 | Guo et al. | |
| 2017/0345370 A1 | 11/2017 | Hack et al. | |
| 2018/0083081 A1 | 3/2018 | Wacyk et al. | |

FOREIGN PATENT DOCUMENTS

| | | | | |
|---|---|---|---|---|
| WO | 2014043850 A1 | | 3/2014 | |
| WO | 2015101328 A1 | | 7/2015 | |
| WO | WO 2015/101328 | * | 7/2015 | H01L 27/32 |
| WO | WO 2015101328 | * | 7/2015 | H01L 27/32 |

OTHER PUBLICATIONS

Eric F, "The Art of Making Large Image Sensors (or Quilting with Silicon)", "Imaging Blog", Feb. 7, 2012, Publisher: Teledyne Dalsa—http://blog.teledynedalsa.com/2012/02/the-art-of-making-large-image-sensors-or-quilting-with-silicon/, Published in: CA.

"Office Action", issued in related U.S. Appl. No. 15/144,142, dated Mar. 23, 2017.

Office Action issued in parent U.S. Appl. No. 15/243,197, dated Jul. 13, 2017.

"Non-Final Office Action", U.S. Appl. No. 15/243,197, dated Sep. 28, 2017, 13 pp.

Final Rejection dated May 7, 2018 for U.S. Appl. No. 15/243,197.

Non-Final Office Action received for U.S. Appl. No. 15/710,602, dated Oct. 5, 2018, 12 pages.

* cited by examiner

Legend:
R   G   B

ARRANGEMENT OF COLOR SUB-PIXELS FOR FULL COLOR OLED AND METHOD OF MANUFACTURING SAME

This application is a divisional of and claims priority of U.S. patent application Ser. No. 15/243,197, filed on Aug. 22, 2016, the disclosure of which is incorporated by reference herein in its entirety.

FIELD OF THE INVENTION

The present invention relates generally to organic light-emitting diode (OLED) display devices and, more particularly, to an improved arrangement of color sub-pixels within a full color OLED display device and method of manufacturing same.

BACKGROUND OF THE INVENTION

OLED display technology has the benefit of a wide operating temperature range, low power consumption, wide viewing angle, high contrast and fast response time making it the best choice for high-resolution displays. While the demand for OLED displays continues to increase, the technology still remains expensive to produce and lacks in overall resolution and performance quality.

Traditional OLED displays include a stack of thin layers formed on a substrate. A light-emitting layer of a luminescent organic solid, as well as adjacent semiconductor layers, is sandwiched between a cathode and an anode. The light-emitting layer may be selected from any of a multitude of fluorescent and phosphorescent organic solids. Any of the layers, and particularly the light-emitting layer, also referred to herein as the emissive layer or the organic emissive layer, may consist of multiple sublayers. In an active-matrix organic light-emitting diode the cathode may include an electrode having low work function, and the anode may include an electrode having high work function. Either anode or cathode may be transparent depending on whether a top or bottom emitting architecture is used.

In a conventional OLED device, when an electric current is applied across the device negatively charged electrons move into the organic material(s) from the cathode. Positive charges, typically referred to as holes, move into the organic material(s) from the anode. The positive and negative charges meet in the center layers (i.e., the semiconducting organic material), combine, and produce photons. The wavelength, and consequently the color, of the photons depends on the electronic properties of the organic material in which the photons are generated. Pixel drivers can be configured as either current sources or voltage sources to control the amount of light generated by the OLEDs in an AMOLED display.

The color of light emitted from the organic light-emitting device can be controlled by the selection of the organic material. Generating red, green and blue light simultaneously may produce white light. Other individual colors, different than red, green and blue, can be also used to produce in combination a white spectrum. The precise color of light emitted by a particular structure can be controlled both by selection of the organic material, as well as by selection of dopants in the organic emissive layers. Alternatively, filters of red, green or blue, or other colors, may be added on top of a white light-emitting pixel. In other examples, white light emitting OLED pixels may be used in monochromatic displays.

High-resolution active matrix displays may include millions of pixels and sub-pixels that are individually addressed by the drive electronics. Each sub-pixel can have several semiconductor transistors and other IC components. Each OLED may correspond to a pixel or a sub-pixel. Generally, however, an OLED display consists of many OLED pixels, and each OLED pixel may have three sub-pixels associated with it, in which each sub-pixel may include red, green and blue color OLEDs or may emit white light, which may be filtered to either red, green or blue. In order to obtain higher pixel density, the arrangement of sub-pixels must be more compact, thereby increasing the manufacturing burden and expense.

Figure 1A:
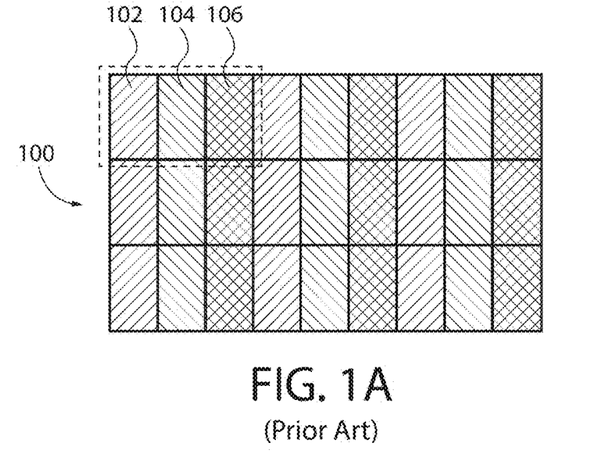
FIG. 1A is a schematic view of a sub-pixel arrangement in stripe form in a prior full-color display panel.

Traditionally, full-color OLED display panels include sub-pixel regions generally arranged in stripe form, mosaic form, or delta form. FIG. 1A depicts a conventional stripe OLED array as used in a variety of OLED display products. In particular, FIG. 1A illustrates a pixel device 100 in matrix form, which is composed of red, green, and blue sub-pixel regions 102, 104, 106. The sub-pixel regions 102, 104, and 106 are arranged in rows on a substrate. The pixel group comprised of sub-pixel regions 102, 104, and 106 is repeated identically along the rows and columns. While this is the most simplified arrangement for manufacturing and circuit design purposes, it provides the poorest color mixing effect.

Figure 1B:
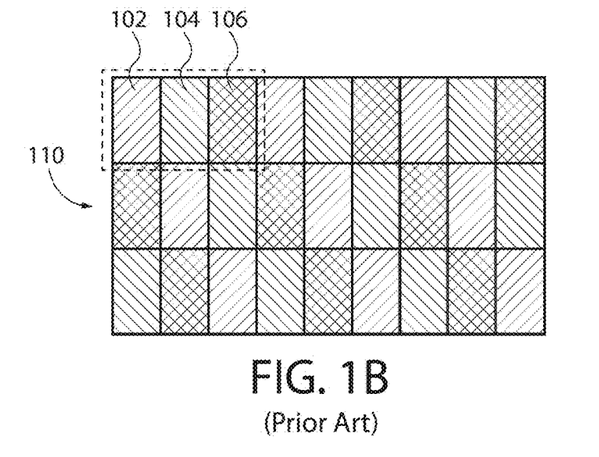
FIG. 1B is a schematic view of a sub-pixel arrangement in mosaic form in a prior full-color display panel.

FIG. 1B depicts a conventional mosaic OLED array 110, in which the pixel group formed from red, green, and blue sub-pixel regions 102, 104, and 106 is repeated identically along the rows and in which pixel groups between rows are separated by the width of one sub-pixel region. Using this sub-pixel arrangement, the color mixing effect is improved. However, the circuit design and driving method remain complicated.

Figure 1C:
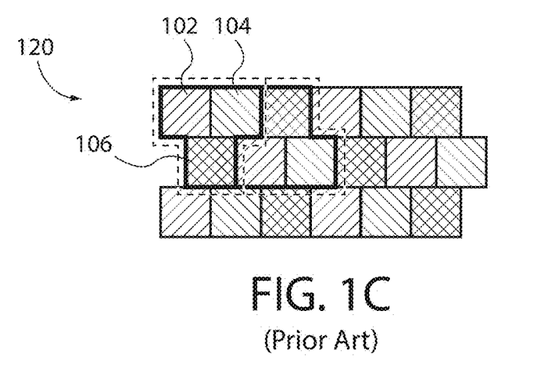
FIG. 1C is a schematic view of a sub-pixel arrangement in delta form in a prior full-color display panel.

FIG. 1C depicts a conventional delta OLED array 120, in which the pixel group formed from red, green, and blue sub-pixel regions is repeated identically along the rows and in which pixel groups between rows are separated by the width of 1.5 sub-pixel regions. Using this sub-pixel arrangement, the color mixing effect is still further improved. However, the circuit design and manufacturing process remain complicated.

Figure 1D:
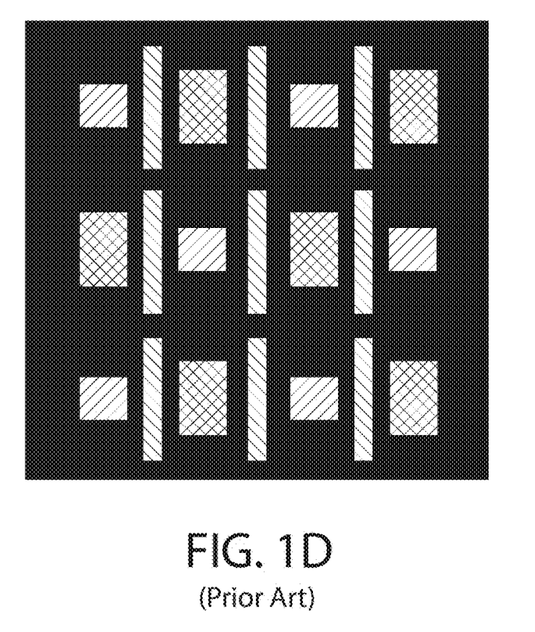
FIG. 1D is a schematic view of a sub-pixel arrangement in PenTile® matrix form in a prior full-color display panel.

Recent improvements to sub-pixel arrangements include PenTile® matrix which is a family of patented sub-pixel schemes specifically designed to operate with proprietary algorithms for sub-pixel rendering embedded in the driver, allowing for easy compatibility with RGB stripe panels. More particularly, PenTile® red, green, blue, green (RGBG) layout has been used in active-matrix organic light-emitting diode (AMOLED) displays whereby green pixels are interleaved with alternating red and blue pixels. FIG. 1D depicts a conventional PenTile® matrix, a registered trademark owned by Samsung, which provides good display performance with a reduction in pixel element count.

Regardless of the arrangement of sub-pixels used to achieve the full color display, the resolution is determined by the manufacturing process of the sub-pixel regions. A shadow mask, also referred to as a metal mask, alignment method is traditionally used to form the individual RGB color sub-pixels within a full-color OLED display, when the color sub-pixels are arranged in side-by-side format. As such, the resolution of the OLED display panel is determined based upon the opening dimensions of the mask and fine etching capabilities.

As can now be appreciated, there exists a need to provide a full color OLED display panel, in which each of the sub-pixels groups are designed in a specific arrangement and can cure some of the deficiencies in the prior art.

It is a primary object of the present invention to provide an OLED display, which utilizes a new OLED architecture with an efficient pixel arrangement manufactured using a shadow mask. The resulting OLED display is a small area display, which measures approximately 1 to 3 inches per side and is ideal for, amongst other things, high-resolution displays in demand for virtual reality headsets.

SUMMARY OF THE INVENTION

The present invention cures some of the deficiencies in the prior art by providing a full color OLED display, which utilizes a new OLED architecture with an efficient pixel arrangement manufactured using a shadow mask.

In accordance with an illustrative embodiment of the present invention, a full-color display panel is provided including a substrate, and a plurality of pixel units formed on the substrate, wherein each pixel unit includes at least three sub-pixels each configured to emit colored light in the pixel unit. Four pixel units are arranged in a two by two block to form a super-pixel, such that each pixel unit is rotated to define a mirror image arrangement within the super-pixel block. At least one sub-pixel abuts the same color sub-pixel of both the vertically and horizontally adjacent pixel units to form a quadruple-sized sub-pixel group.

Each sub-pixel of the full-color display panel has an area. The colors of the sub-pixels of each pixel unit may be red, green, and blue. The blue sub-pixel area may be double the red or green sub-pixel area within each pixel unit. The super-pixel blocks may be arranged on the substrate such that at least two sub-pixel groups are at least quadruple the size of the respective sub-pixel area. The plurality of super-pixel blocks may be arranged on the substrate such that at least one sub-pixel group is at least octuple the size of the respective sub-pixel area.

In accordance with another illustrative embodiment of the present invention, a display panel comprising a super-pixel repeating block is provided including four pixel units, wherein each of the pixel units includes a first sub-pixel configured to emit a first color light, a second sub-pixel configured to emit a second color light, and a third sub-pixel configured to emit a third color light. The first or second sub-pixel abuts the same-color sub-pixel of the adjacent pixel unit thereof to form at least a double-sized sub-pixel area. The third sub-pixel abuts the same-color sub-pixel of all adjacent pixel units thereof to form at least a quadruple-sized sub-pixel area. The first color light, the second color light and the third color light are one of emitted through or from respective organic layers of the first color sub-pixel, the second color sub-pixel and the third color sub-pixel.

The first, second, and third color light may be one of red, green, or blue light. Each of the pixel units may be square. At least one of the sub-pixels may be square. At least one of the sub-pixels may be rectangular. The display panel may be an organic light emitting display panel.

In accordance with another illustrative embodiment of the present invention, a method of manufacturing a display panel is provided. The method includes providing a substrate and simultaneously providing a plurality of first sub-pixels of the display panel, wherein each of the first sub-pixels emits a first light, simultaneously providing a plurality of second sub-pixels of the display panel, wherein each of the second sub-pixels emits a second light, and simultaneously providing a plurality of third sub-pixels of the display panel, wherein each of the third sub-pixels emits a third light. The display panel includes a plurality of pixel units, each of the pixel units having first, second and third sub-pixels, wherein four pixel units are arranged in a two by two block to define a super-pixel block, such that each pixel unit is rotated to define a mirror image arrangement within the super-pixel block. The super-pixel block is repeatedly formed on the substrate such that repeating sub-pixel blocks form sub-pixel groups with adjacent sub-pixels having the same color.

The method may include simultaneously providing the first, second and third sub-pixels, including using a shadow mask or fine metal mask. The method may include each of the pixel units being square. At least one of the sub-pixels may be square. The method may include at least one of the sub-pixels being rectangular. The method may include an area of the first and second sub-pixels being substantially equal to an area of the third sub-pixel. The method may include the first, second, and third color sub-pixels being organic layers.

BRIEF DESCRIPTION OF THE DRAWINGS

To these and to such other objects that may hereinafter appear, the present invention relates to an improved arrangement of color sub-pixels within a full color OLED display device and method of manufacturing same as described in detail in the following specification and recited in the annexed claims, taken together with the accompanying drawings, in which like numerals refer to like parts in which:

DETAILED DESCRIPTION

Reference will now be made in detail to the preferred embodiments of the present invention, examples of which are illustrated in the accompanying drawings. Wherever possible, the same reference numerals are used in the drawings and the description to refer to the same or like parts.

Figure 4:
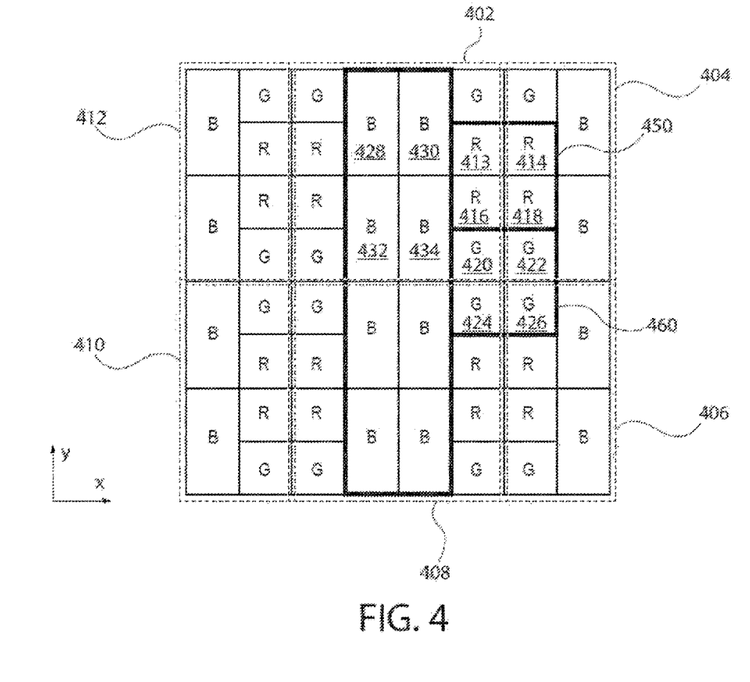
FIG. 4 is a schematic view of a sub-pixel arrangement in a full-color display panel with the repeating super-pixel block of FIG. 3A in accordance with an illustrative embodiment of the present invention.

In accordance with the present invention shown in FIG. 4, the full-color organic light-emitting diode (OLED) display panel includes a plurality of pixel units arranged on a substrate to define a display frame. In the display panel, each pixel unit includes a plurality of sub-pixels designed in a specific arrangement so as to increase the area of the mask openings in the manufacturing process and reduce the risk of inaccuracies. The specific arrangement of sub-pixels is also designed so as to support mask openings in the manufacturing process that enable color sub-pixels with no gap between them to eliminate any screen-door artifacts.

Figure 2A:
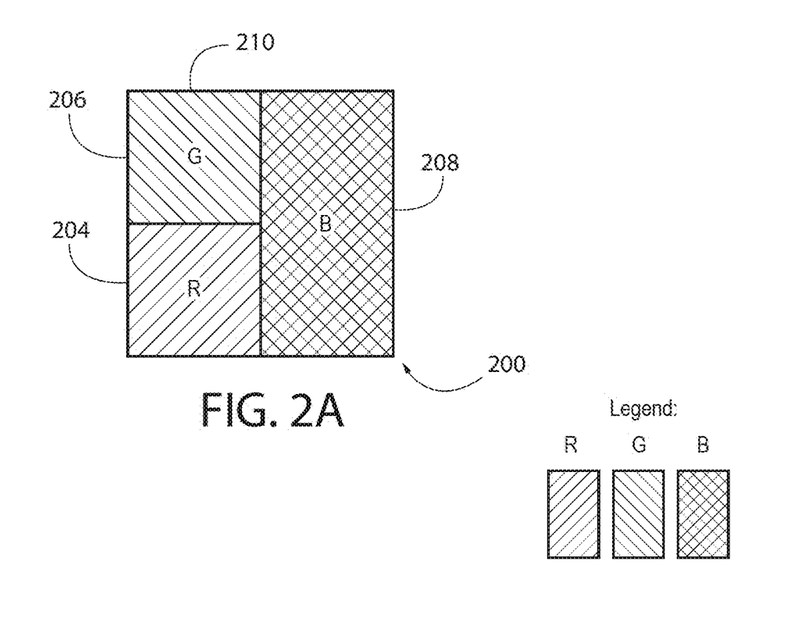
FIG. 2A is a schematic view of a single sub-pixel unit in a full-color display panel in accordance with an illustrative embodiment of the present invention.
Figure 2B:
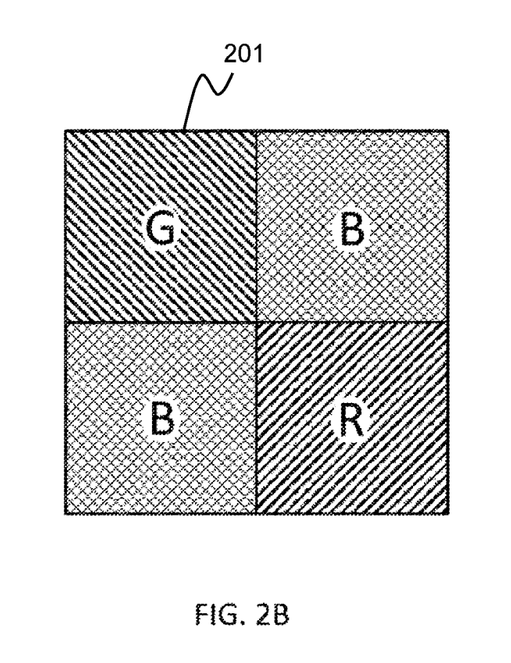
FIG. 2B is a schematic view of an alternate arrangement of a single sub-pixel unit in a full-color display panel in accordance with an illustrative embodiment of the present invention.

FIG. 2A illustrates a plan view of a pixel unit or array 200 in accordance with the OLED display panel of the present invention. The pixel unit 200 includes a plurality of sub-pixel elements each configured to emit light. Preferably, the sub-pixel elements are organic light-emitting diodes, wherein the first sub-pixel emits a first color light, the second sub-pixel emits a second color light, and the third sub-pixel emits a third color light. In the preferred embodiment, the first OLED sub-pixel is a red (R) sub-pixel 204, the second OLED sub-pixel is a green (G) sub-pixel 206, and the third OLED sub-pixel is a blue (B) sub-pixel 208, which emit red, green and blue light respectively, and which define a gamut of the display device. The commonly used red, green, and blue (RGB) OLED sub-pixels are described as an example of the three OLED sub-pixels. In other embodiments, OLED sub-pixels of other three colors may be used, or alternatively a white (W) OLED sub-pixel or a yellow (Y) OLED sub-pixel may be selected as one or more of the OLED sub-pixels. FIG. 2B illustrates a plan view of an alternate pixel unit 201 having an alternate arrangement of RGB OLED sub-pixels configured to emit light.

FIG. 2A further illustrates the red sub-pixel 204 and the green sub-pixel 206 form the column row 210 of the pixel unit 200. The blue sub-pixel 208 forms the second column of the pixel unit 200 and is approximately equal in area to the combined red and green sub-pixels 204 and 206. In general, the blue sub-pixel in a conventional organic light emitting display device has the shortest life. Therefore, the blue sub-pixel 208 has the largest area in order improve the life expectancy. The arrangement of sub-pixels in other pixel units is identical to that in pixel unit 200. It should be understood that the blocks are shown herein as squares for illustrative purposes and are not to be limited to square, diamond, polygonal, or circular.

Figure 3A:
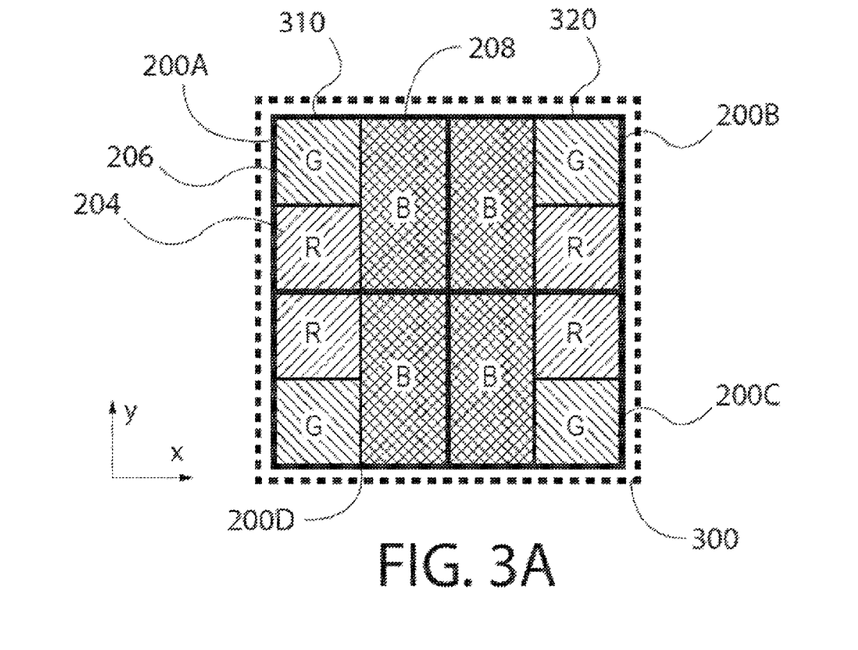
FIG. 3A is a schematic view of a super-pixel block in a full-color display panel in accordance with an illustrative embodiment of the present invention.
Figure 3B:
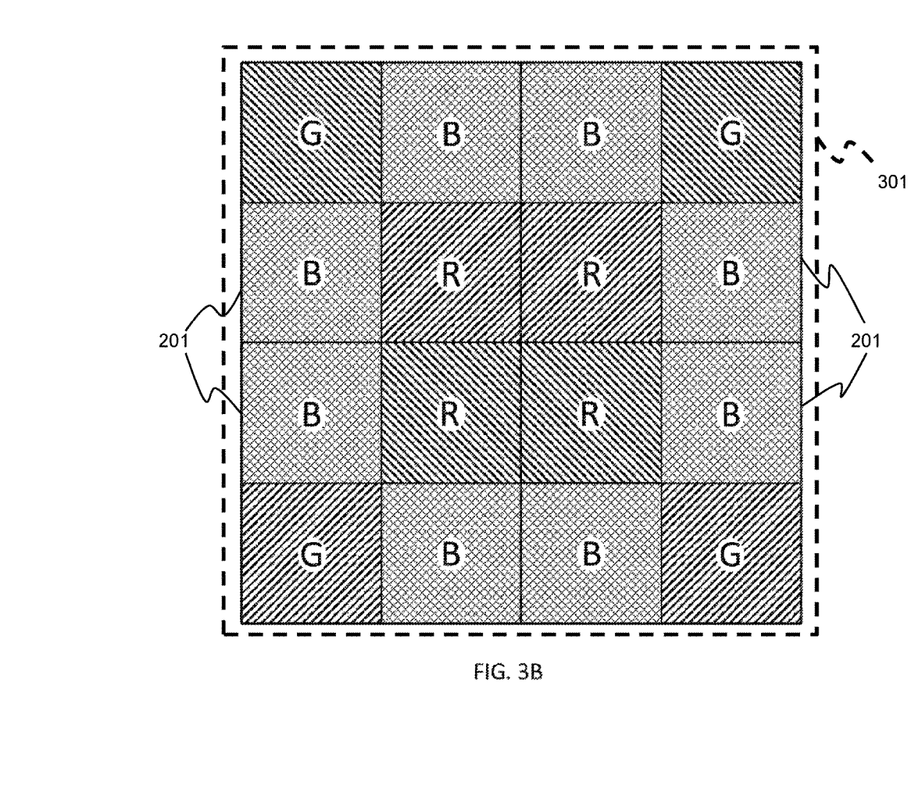
FIG. 3B is a schematic view of an alternate arrangement of a super-pixel block in a full-color display panel in accordance with an illustrative embodiment of the present invention.

FIG. 3A illustrates a plan view of a super-pixel block 300 (circled by the black dotted bold line) in accordance with the illustrative embodiment of the present invention. The super-pixel block 300 includes four pixel units 200A, 200B, 200C and 200D (circled by the solid black lines) arranged in the 2×2 super-pixel block 300, wherein the first pixel unit 200A is arranged in a first position, the second pixel unit 200B is arranged in a second position, the third pixel unit 200C is arranged in a third position, and the fourth pixel unit 200D is arranged a fourth position. In the preferred embodiment, the pixel units 200A, 200B, 200C and 200D are orientated in position such that the blue sub-pixels 208 of each pixel unit 200A, 200B, 200C, and 200D are disposed in the center of the super-pixel block 300. The green sub-pixels 206 of each pixel unit 200A, 200B, 200C and 200D within the super-pixel block 300 are arranged in each of the corners of the super-pixel block 300. The red sub-pixels 204 of the first and fourth pixel unit 200A and 200D respectively, are positioned adjacent one another in a first column 310, while the red sub-pixels 204 of the second and third pixel unit 200B and 200C, respectively, are positioned adjacent one another in a fourth column 320. FIG. 3B illustrates a plan view of an alternate super-pixel block 301 (circled by the black dotted bold line) having an arrangement of alternate pixel units 201 from FIG. 2B. In this alternate arrangement, the alternate pixel units 201 are orientated in position such that the red sub-pixels 204 of each pixel unit are disposed in the center of the alternate super-pixel block 301.

FIG. 4 illustrates a sub-pixel arrangement in a full-color display panel in accordance with an illustrative embodiment of the present invention. It should be noted that lines and hatching within each sub-pixel block to denote like colors has been omitted for simplicity. The super-pixel block 300 (circled by various dotted and dashed black lines) is repeated in order to form a mosaic of pixel units 200. In this embodiment, a plurality of sub-pixel blocks are arranged adjacent one another such that sub-pixels of the first sub-pixel block 402 and sub-pixels of several adjacent sub-pixel block 404, 406, 408, 410 and 412 are adjacent and have the same color. In this arrangement, four red sub-pixels 413, 414, 416, and 418 are adjacent and have the same color, four green sub-pixels 420, 422, 424, and 426 are adjacent and have the same color, and four blue sub-pixels 428, 430, 432, and 434 are adjacent and have the same color. Consequently, the four red sub-pixels 413, 414, 416, and 418 in adjacent sub-pixel blocks 402 and 404, respectively, form a red sub-pixel group 450. The red sub-pixel group 450 is four times, quadruple, the area of a single red sub-pixel since it is formed by four adjacent sub-pixels 413, 414, 416, and 418. The four green sub-pixels 420, 422, 424, and 426 in adjacent sub-pixel blocks 402, 404, 406, and 408, respectively, form a green sub-pixel group 460. The green sub-pixel group 460 is four times, quadruple, the area of a single green sub-pixel since it is formed by four adjacent sub-pixels 420, 422, 424, and 426. The blue sub-pixels 428 and 430 form a blue sub-pixel group whose total area is the same as the red sub-pixel group 450. It is also the same area as the green sub-pixel group 460. Because these sub-pixel groups are all equal in size they can be formed by using a metal shadow mask with the same size openings. In the preferred embodiment, a single metal mask can be used to manufacture each of the three colors by simply shifting it to the corresponding position required for the deposition of the specific color.

It is to be understood that the colors of adjacent sub-pixels of adjacent sub-pixel blocks are identical, and that adjacent sub-pixels with the same color in adjacent sub-pixel blocks form a sub-pixel group so that the area of the sub-pixel group is larger than the area of a single sub-pixel.

Figure 5A:
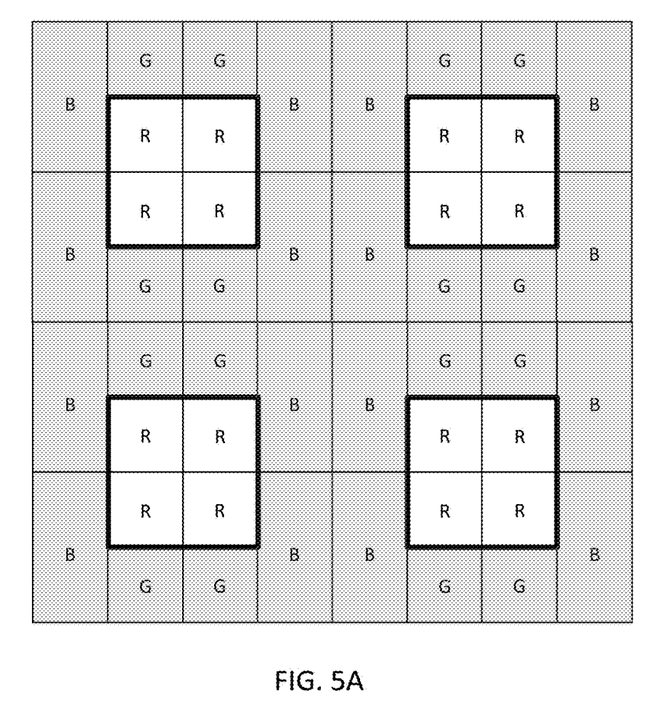
FIG. 5A is a top view of a shadow mask used for forming the first sub-pixel element in a full-color display panel in accordance with an illustrative embodiment of the present invention.
Figure 5B:
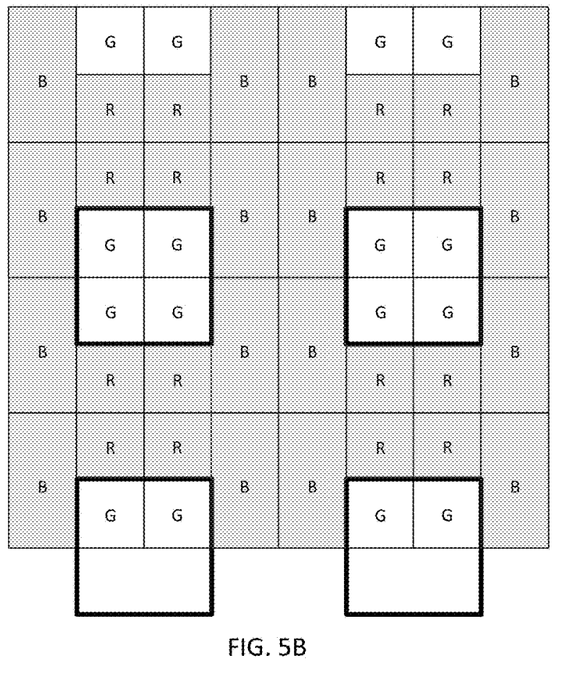
FIG. 5B is a top view of a shadow mask used for forming the second sub-pixel element in a full-color display panel in accordance with an illustrative embodiment of the present invention
Figure 5C:
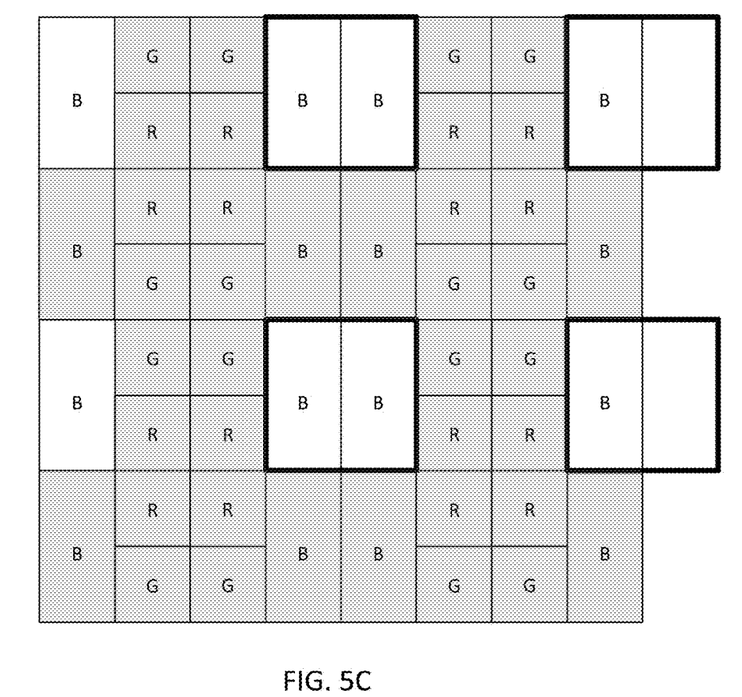
FIG. 5C is a top view of a shadow mask used for forming a first group of the third sub-pixel element in a full-color display panel in accordance with an illustrative embodiment of the present invention.
Figure 5D:
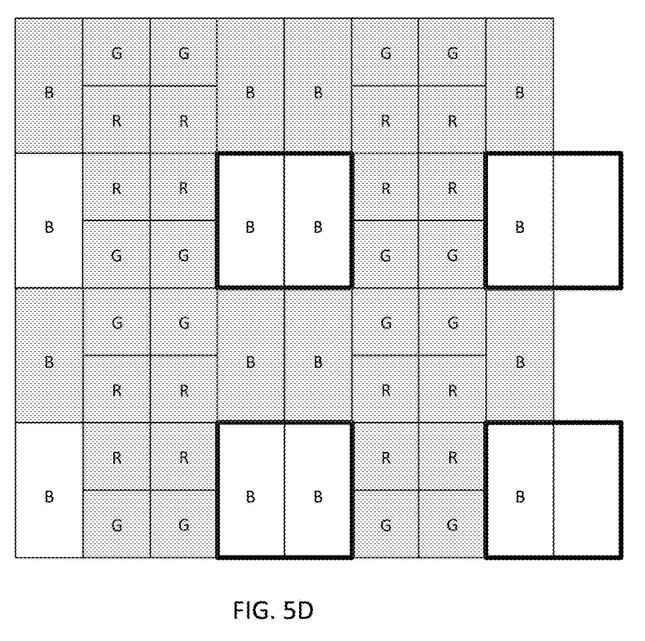
FIG. 5D is a top view of a shadow mask used for forming a second group of the third sub-pixel element in a full-color display panel in accordance with an illustrative embodiment of the present invention.

FIGS. 5A-5D illustrate the preferred manufacturing method using a single shadow mask to deposit all three colors in sequence. The mask has openings that are four times the size of a color sub-pixel to achieve a higher resolution with the same manufacturing process. FIG. 5A shows the shadow mask with openings (shown by the black bold line) positioned for the red sub-pixel group. The openings form a square array with metal shown as shaded area. The mask requires metal strips in both the horizontal and vertical directions located between openings for structural support. FIG. 5B shows the same shadow mask shifted over the green sub-pixel group for deposition of the green OLED material. FIG. 5C shows the shadow mask shifted over the first group of blue sub-pixels, and FIG. 5D shows the mask over the second group of blue sub-pixels. In this way a single shadow mask can be used to manufacture all three colors. The shadow mask has good structural support due to the metal between openings running in both horizontal and vertical directions which is important in the manufacturing process. The mask must remain flat and at a constant distance from the substrate across its entire area. An additional benefit of this arrangement of sub-pixels is that the shadow mask can be used to produce color sub-pixels with nearly zero gaps between different color groups. This helps to avoid the screen door effect at shown in FIG. 1D.

It is to be understood that the disclosure describes a few embodiments and that many variations of the invention can easily be devised by those skilled in the art after reading this disclosure and that the scope of the present invention is to be determined by the following claims.

What is claimed is:

1. A method of manufacturing a display panel, the method comprising:
   providing a substrate;
   aligning an aperture of a shadow mask to a first position on the substrate configured to simultaneously deposit a first Organic Light Emitting Diode (OLED) material on a plurality of first sub-pixels of the display panel, wherein each of the plurality of first sub-pixels is capable of emitting a first color light;
   aligning the aperture of the shadow mask to a second position on the substrate configured to simultaneously deposit a second OLED material on a plurality of second sub-pixels of the display panel, wherein each of the plurality of second sub-pixels is capable of emitting a second color light, wherein the second OLED material is adjacent the first OLED material along a first line defined by a linear boundary edge of the second OLED material;
   aligning the aperture of the shadow mask to a third position on the substrate configured to simultaneously deposit a third OLED material on a plurality of third sub-pixels of the display panel, wherein each of the plurality of third sub-pixels is capable of emitting a third color light, wherein the third OLED material deposited in the third position of the shadow mask is adjacent at portion of the second OLED material along a second line defined by a linear boundary edge of the third OLED material, and
   aligning the aperture of the shadow mask to a fourth position on the substrate configured to simultaneously deposit the third OLED material on the plurality of third sub-pixels of the display panel, wherein the third OLED material deposited in the fourth position of the shadow mask is adjacent an intersection of the first line defined by the linear boundary edge of the second OLED material and the second line defined by the linear boundary edge of the third OLED material;
   wherein the display panel comprises a plurality of pixel units, each of the plurality of pixel units having the first, second and third sub-pixels, wherein four pixel units are arranged in a two by two block to define a super-pixel block, such that each pixel unit is rotated to define a mirror image arrangement along central horizontal and vertical axes within the super-pixel block,
   wherein the super-pixel block is repeatedly formed on the substrate such that repeating sub-pixel blocks form sub-pixel groups with adjacent sub-pixels being capable of emitting the same color light.

2. The method of claim 1 wherein each of the pixel units is square.

3. The method of claim 1 wherein at least one of the sub-pixels is square.

4. The method of claim 1 wherein a sum of an area of the plurality of first sub-pixels and an area of the plurality of second sub-pixels is substantially equal to an area of the plurality of third sub-pixels.

5. The method of claim 1 wherein at least one of the first, second, and third color sub-pixels include an organic layer.

6. The method of claim 1 wherein the aperture in the shadow mask is equal to four times the size of a single sub-pixel of a pixel unit.

* * * * *